US010164578B2

(12) United States Patent
Granger-Jones et al.

(10) Patent No.: US 10,164,578 B2
(45) Date of Patent: Dec. 25, 2018

(54) FREQUENCY SELECTIVE LOW NOISE AMPLIFIER CIRCUIT (71) Applicant: Qorvo US, Inc., Greensboro, NC (US)

(72) Inventors: Marcus Granger-Jones, Scotts Valley, CA (US); Nadim Khlat, Cugnaux (FR); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/689,181

(22) Filed: Aug. 29, 2017

(65) Prior Publication Data
US 2018/0069510 A1  Mar. 8, 2018

Related U.S. Application Data (60) Provisional application No. 62/383,904, filed on Sep. 6, 2016.

(51) Int. Cl.
*H03F 3/191* (2006.01)
*H03F 1/06* (2006.01)
(Continued)

(52) U.S. Cl.
CPC ............... *H03F 1/06* (2013.01); *H03F 1/14* (2013.01); *H03F 1/223* (2013.01); *H03F 1/26* (2013.01); *H03F 1/565* (2013.01); *H03F 3/45188* (2013.01); *H03F 3/45475* (2013.01); *H03F 3/45636* (2013.01); *H03F 3/45668* (2013.01); *H03G 3/3068* (2013.01); *H03H 11/1291* (2013.01); *H03F 2200/153* (2013.01); *H03F 2200/489* (2013.01); *H03F 2203/45264* (2013.01); *H03F 2203/45318* (2013.01); *H03F 2203/45386* (2013.01);
(Continued)

(58) Field of Classification Search
CPC ............... H03F 3/191; H03F 2200/153
USPC ............................. 330/283, 302
See application file for complete search history.

(56) References Cited

U.S. PATENT DOCUMENTS 7,266,360 B2 *  9/2007  Kang ............. H04B 1/28
                                                 330/131
8,314,653 B1  11/2012  Granger-Jones et al.

OTHER PUBLICATIONS

Lee, Thomas H., "The Design of CMOS Radio-Frequency Integrated Circuits—Chapter 11: LNA Design," Cambridge University Press, First Published 1998, pp. 272-305.

* cited by examiner

Primary Examiner — Steven J Mottola
(74) Attorney, Agent, or Firm — Withrow & Terranova, P.L.L.C.

(57) ABSTRACT

Embodiments of the disclosure relate to a frequency selective low noise amplifier (LNA) circuit, which includes a transconductive LNA(s). In one aspect, filter circuitry is provided in a degeneration path of a transconductive LNA(s) to pass in-band frequencies and reject out-of-band frequencies by generating low impedance and high impedance at the in-band frequencies and the out-of-band frequencies, respectively. However, having the filter circuitry in the degeneration path may cause instability in the transconductive LNA. As such, a feedback path is coupled between an input node of the transconductive LNA(s) and the degeneration path to provide a feedback to improve stability of the transconductive LNA(s). In addition, the feedback can help improve impedance match in the frequency selective LNA circuit. As a result, the transconductive LNA(s) is able to achieve improved noise figure (NF) (e.g., below 1.5 dB), return loss, linearity, and stability, without compromising LNA gain.

22 Claims, 9 Drawing Sheets (51) Int. Cl.
*H03G 3/30* (2006.01)
*H03F 3/45* (2006.01)
*H03F 1/26* (2006.01)
*H03H 11/12* (2006.01)
*H03F 1/14* (2006.01)
*H03F 1/22* (2006.01)
*H03F 1/56* (2006.01)
H03G 5/28 (2006.01)

(52) U.S. Cl.
CPC . *H03F 2203/45512* (2013.01); *H03G 3/3063* (2013.01); *H03G 5/28* (2013.01)

FREQUENCY SELECTIVE LOW NOISE AMPLIFIER CIRCUIT

RELATED APPLICATIONS

This application claims the benefit of provisional patent application Ser. No. 62/383,904, filed Sep. 6, 2016, the disclosure of which is hereby incorporated herein by reference in its entirety.

FIELD OF THE DISCLOSURE

The technology of the disclosure relates generally to low noise amplifiers (LNAs).

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Filters and low noise amplifiers (LNAs) are the basic building blocks of the mobile communication devices. The filters, which can include band pass filters, band stop filters, high pass filters, and low pass filters, are typically coupled to radio frequency (RF) transceivers to enable frequency selection and noise suppression. The purpose of the LNAs, on the other hand, is to amplify a received radio frequency (RF) signal to an acceptable level with minimum self-generated additional noise. Gain, noise figure (NF), impedance matching, linearity, and stability are the de facto standards for determining LNA performance. As such, it may be desired to design LNAs with improved gain, NF, linearity, and stability to further enhance the user experiences of the mobile communication devices.

SUMMARY

Embodiments of the disclosure relate to a frequency selective low noise amplifier (LNA) circuit, which includes a transconductive LNA(s). In one aspect, filter circuitry is provided in a degeneration path of a transconductive LNA(s) to pass in-band frequencies and reject out-of-band frequencies by generating low impedance and high impedance at the in-band frequencies and the out-of-band frequencies, respectively. However, having the filter circuitry in the degeneration path may cause instability in the transconductive LNA(s). As such, a feedback path is coupled between an input node of the transconductive LNA(s) and the degeneration path to provide feedback to improve stability of the transconductive LNA(s). In addition, the feedback provided by the feedback path can help improve impedance match in the frequency selective LNA circuit. As a result, the transconductive LNA(s) is able to achieve improved noise figure (NF) (e.g., below 1.5 dB), return loss, linearity, and stability, without compromising LNA gain.

In one aspect, a frequency selective LNA is provided. The frequency selective LNA includes a radio frequency (RF) input node configured to receive an RF signal in a defined frequency band. The frequency selective LNA also includes a transconductive LNA having an input node configured to receive the RF signal, an output node configured to output the RF signal, and a common node. The frequency selective LNA also includes a degeneration path coupled to the common node. The degeneration path includes degeneration circuitry having an input end and an output end. The frequency selective LNA also includes filter circuitry provided in the degeneration path between the common node of the transconductive LNA and the input end of the degeneration circuitry. The filter circuitry is configured to generate a first impedance at in-band frequencies of the defined frequency band. The filter circuitry is also configured to generate a second impedance higher than the first impedance at out-of-band frequencies outside the defined frequency band. The frequency selective LNA also includes a feedback path provided between the input node of the transconductive LNA and the input end of the degeneration circuitry to generate an impedance at the input node to cause the transconductive LNA to have a Rollett stability factor greater than one. The frequency selective LNA also includes input matching circuitry coupled between the RF input node and the input node of the transconductive LNA and configured to provide an input impedance comprising the impedance generated by the feedback path to match to a source impedance at the RF input node.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a frequency selective low noise amplifier (LNA) circuit, which includes a transconductive LNA(s). In one aspect, filter circuitry is provided in a degeneration path of a transconductive LNA(s) to pass in-band frequencies and reject out-of-band frequencies by generating low impedance and high impedance at the in-band frequencies and the out-of-band frequencies, respectively. However, having the filter circuitry in the degeneration path may cause instability in the transconductive LNA(s). As such, a feedback path is coupled between an input node of the transconductive LNA(s) and the degeneration path to provide feedback to improve stability of the transconductive LNA(s). In addition, the feedback generated by the feedback path can help improve impedance match in the frequency selective LNA circuit. As a result, the transconductive LNA(s) is able to achieve improved noise figure (NF) (e.g., below 1.5 dB), return loss, linearity, and stability, without compromising LNA gain.

Figure 1:
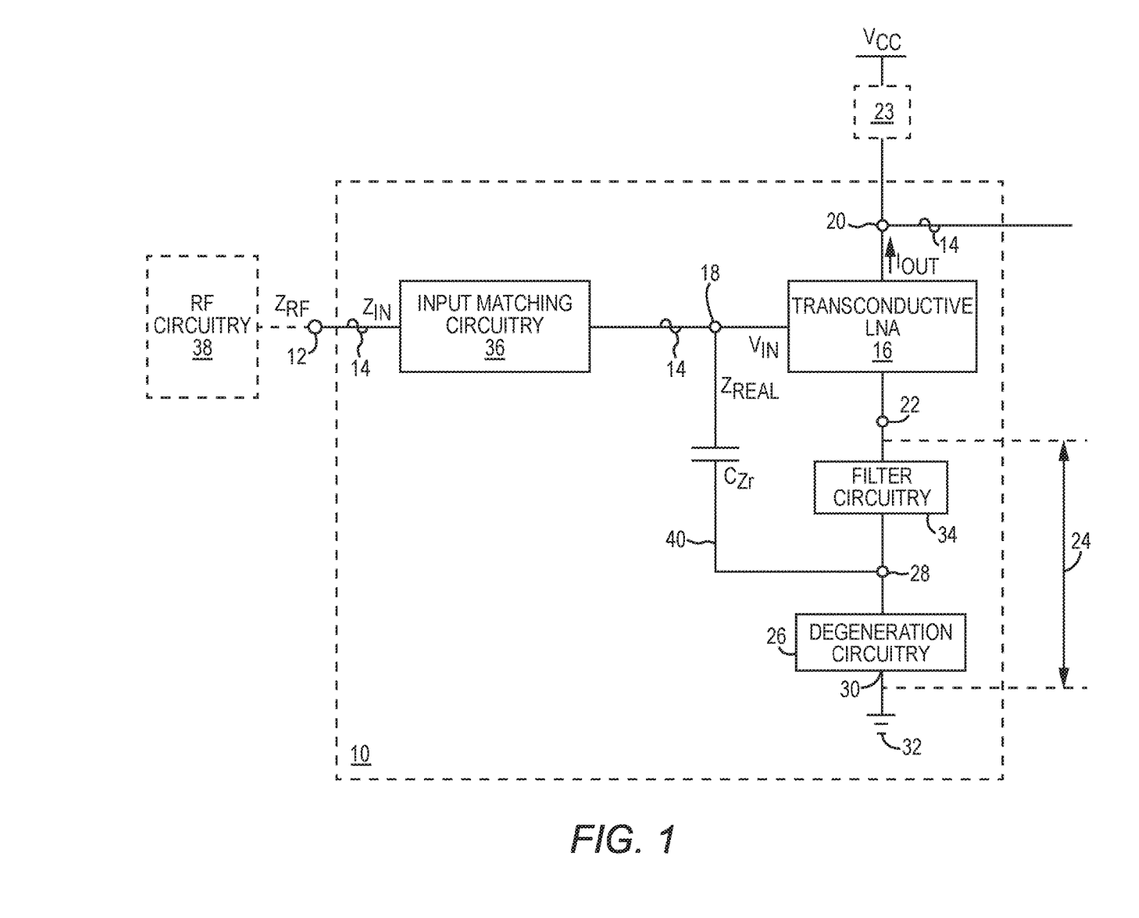
FIG. 1 is a schematic diagram of an exemplary frequency selective low noise amplifier (LNA) circuit configured to provide improved linearity, impedance match, and stability without compromising LNA gain.

FIG. 1 is a schematic diagram of an exemplary frequency selective LNA circuit 10 configured to provide improved linearity, impedance match, and stability without compromising LNA gain. The frequency selective LNA circuit 10 includes a radio frequency (RF) input node 12 configured to receive an RF signal 14 in a defined frequency band, such as long-term evolution (LTE) band forty-one (2.496-2.690 GHz) for example. The frequency selective LNA circuit 10 also includes a transconductive LNA 16 having an input node 18, an output node 20, and a common node 22. The transconductive LNA 16 is configured to receive the RF signal 14 at the input node 18 and output the RF signal 14 at the output node 20. The frequency selective LNA circuit includes output matching circuitry 23 provided between the output node 20 and a voltage source $V_{CC}$.

The transconductive LNA 16, which can be referenced interchangeably as a transconductance amplifier, is an amplifier configured to generate an output current $I_{OUT}$ at the output node 20 when an input voltage $V_{IN}$ is applied to the input node 18. In this regard, the output current $I_{OUT}$ changes in response to changes of the input voltage $V_{IN}$ applied between the input node 18 and the common node 22. The transconductance $g_m$ of the transconductive LNA 16 is defined by equation (Eq. 1) below.

$$g_m = \frac{I_{OUT}}{V_{IN}} \qquad \text{(Eq. 1)}$$

The frequency selective LNA circuit 10 includes a degeneration path 24 coupled to the common node 22 of the transconductive LNA 16. The degeneration path 24 includes degeneration circuitry 26 having an input end 28 and output end 30. The output end 30 of the degeneration circuitry 26 may be coupled to a ground 32.

Filter circuitry 34 is provided in the degeneration path 24 in between the common node 22 and the input end 28. In this regard, the filter circuitry 34 and the degeneration circuitry 26 are coupled in series between the common node 22 and the ground 32. The filter circuitry 34 is configured to generate a first impedance (e.g. approximately 1Ω) at in-band frequencies of the defined frequency band. In this regard, the degeneration path 24 can be seen as an equivalent of a shorted path. Accordingly, the filter circuitry 34 behaves as a band-pass filter to pass the RF signal 14 in the defined frequency band. The filter circuitry 34 is further configured to generate a second impedance substantially higher than the first impedance (e.g., greater than 100Ω) to make the degeneration path 24 equivalent to an open path. In this regard, the filter circuitry 34 can suppress the out-of-band frequencies located outside the defined frequency band). By functioning as a band-pass filter with stop band zeros, the filter circuitry 34 can provide additional out-of-band attenuation to help improve out-of-band linearity of the transconductive LNA 16. As a result, the filter circuitry 34 can help improve the NF of the transconductive LNA 16 to below 1.5 dB. Further, by supporting frequency selectivity in the transconductive LNA 16, it may be possible to relax requirements on pre-selection filters provided in front of the transconductive LNA 16, thus leading to improved NF in a receive chain of the frequency selective LNA circuit 10.

The frequency selective LNA circuit 10 includes input matching circuitry 36 coupled between the RF input node 12 and the input node 18 of the transconductive LNA 16. The RF input node 12 may be coupled to RF circuitry 38, which can be antenna front end circuitry for example. Looking from the RF input node 12 into the RF circuitry 38, the RF circuitry 38 can be seen as an RF source impedance $Z_{RF}$ (e.g., 50Ω) to the frequency selective LNA circuit 10. In this regard, the input matching circuitry 36 needs to generate an input impedance $Z_{IN}$ (e.g., 50Ω) to match the RF source impedance $Z_{RF}$ at the RF input node 12. If the input impedance $Z_{IN}$ does not match the RF source impedance $Z_{RF}$ at the RF input node 12, there may be an increased return loss at the RF input node 12 at the in-band frequencies of the defined frequency band, which may lead to a reduced gain at the output node 20 of the transconductive LNA 16.

To enable the input matching circuitry 36 to generate the input impedance $Z_{IN}$ at the in-band frequencies, the frequency selective LNA circuit 10 further includes a feedback path 40 provided between the input node 18 of the transconductive LNA 16 and the input end 28 of the degeneration circuitry 26. The feedback path 40 is configured to provide impedance $Z_{REAL}$ at the input node 18. Notably, the impedance $Z_{REAL}$ is a complex impedance including a real component and an imaginary component. In a non-limiting example, the feedback path 40 includes a feedback capacitor $C_{Zr}$ configured to generate the real component of the impedance $Z_{REAL}$. The input matching circuitry 36 is configured to include the impedance $Z_{REAL}$ as part of the input impedance $Z_{IN}$ to match the RF source impedance $Z_{RF}$. More specifically, the input matching circuitry 36 is configured to match net impedance at the input node 18 of the transconductive LNA 16, which includes the real component of the impedance $Z_{REAL}$, to the RF source impedance $Z_{RF}$. Phase shifts within the feedback network result in the capacitive impedance of the $C_{Zr}$ capacitor to appear as positive real impedance, $Z_{REAL}$ at the input node 18.

In addition, as discussed later in FIG. 2, the feedback path 40 can help improve stability of the transconductive LNA 16 at the in-band frequencies, particularly when the filter circuitry 34 is implemented by medium quality factor (Q-factor) components having Q-factors between 10 and 35. In this regard, the impedance $Z_{REAL}$ generated by the feedback path 40 is critical to improving stability of the transconductive LNA 16. As a result of the improved stability, it is possible to implement the filter circuitry 34 with lower cost components, thus helping to provide more design and implementation flexibilities.

In summary, by incorporating the filter circuitry 34 in the degeneration path 24, the frequency selective LNA circuit 10 can provide both in-band and out-of-band frequency filtering without requiring the pre-selection filter(s). As a result, it is possible to concurrently improve linearity and NF in the transconductive LNA 16 while enabling frequency selectivity in the degeneration path 24. Further, by providing the feedback path 40 between the input node 18 and the degeneration path 24, the frequency selective LNA circuit 10 can achieve improved impedance matching and stability for the transconductive LNA 16. As a result, it is possible to reduce return loss and employ medium Q-factor components in the filter circuitry 34.

Figure 2:
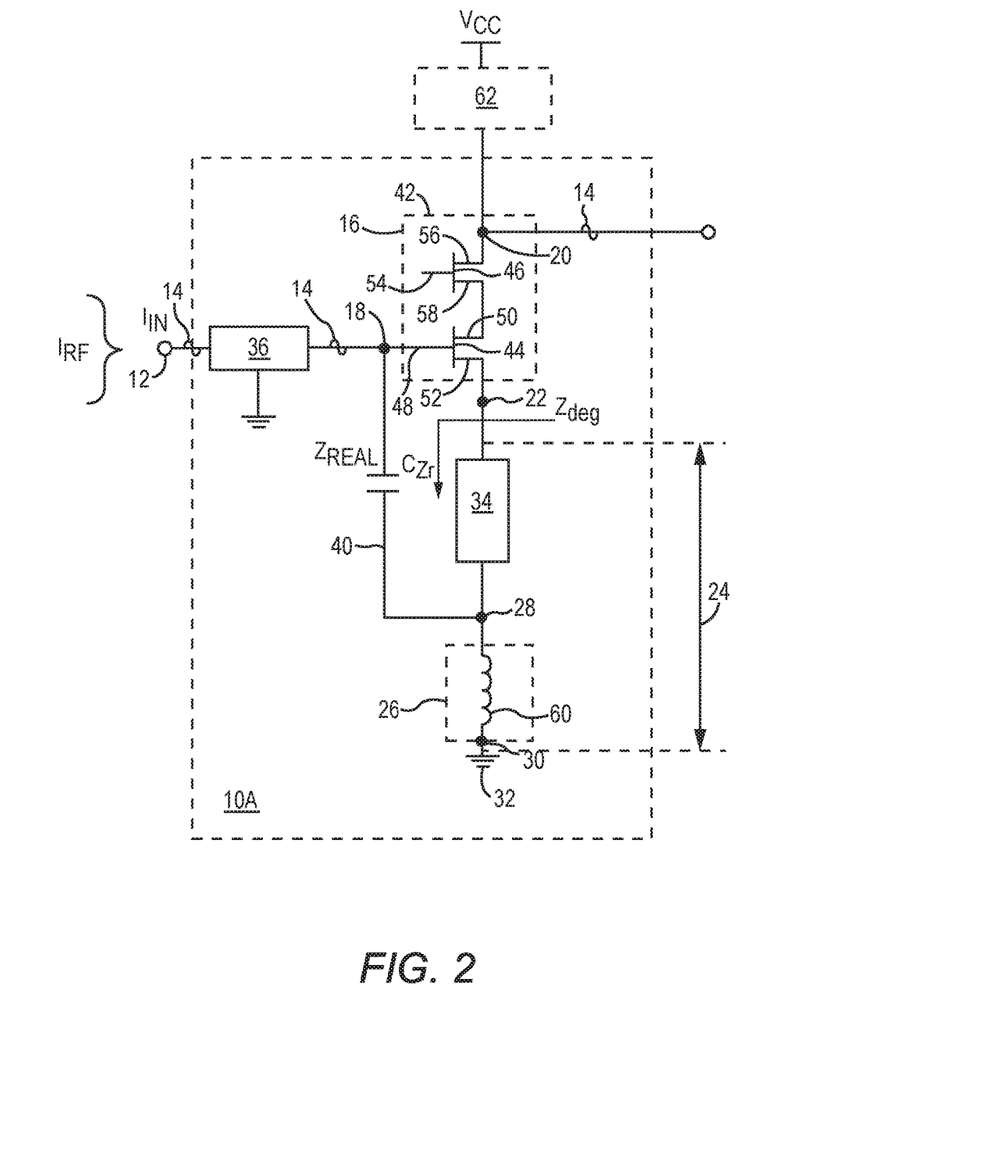
FIG. 2 is a schematic diagram of an exemplary frequency selective LNA circuit adapted from the frequency selective LNA circuit of FIG. 1 by implementing a transconductive LNA as a cascode common source LNA.

FIG. 2 is a schematic diagram of an exemplary frequency selective LNA circuit 10A adapted from the frequency selective LNA circuit 10 of FIG. 1 by implementing the transconductive LNA 16 as a cascode common source LNA 42. Common elements between FIGS. 1 and 2 are shown therein with common element numbers and will not be re-described herein.

The transconductive LNA 16 includes a first stage transistor 44 and a second stage transistor 46. In a non-limiting example, each of the first stage transistor 44 and the second stage transistor 46 can be a field-effect transistor (FET), a metal-oxide semiconductor FET (MOSFET), or a bipolar junction transistor (BJT). The first stage transistor 44 includes a first gate electrode 48, a first drain electrode 50, and a first source electrode 52. The second stage transistor 46 includes a second gate electrode 54, a second drain electrode 56, and a second source electrode 58.

The first gate electrode 48 and the first source electrode 52 are coupled to the input node 18 and the common node 22, respectively. The first drain electrode 50 is coupled to the second source electrode 58. The second drain electrode 56 is coupled to the output node 20. The second gate electrode 54 may be left floating or coupled to the ground 32. In a non-limiting example, the degeneration circuitry 26 includes a degeneration inductor 60 coupled between the input end 28 of the degeneration circuitry 26 and the ground 32. The frequency selective LNA circuit 10A may include output matching circuitry 62 coupled between the output node 20 and a voltage source $V_{CC}$.

According to previously discussed in FIG. 1, the filter circuitry 34 is configured to generate low impedance (the first impedance) at the in-band frequencies of the defined frequency band. Accordingly, the filter circuitry 34 and the degeneration inductor 60 can be seen as having near zero impedance. In this case, when looking into the degeneration path 24 from the input node 18, impedance $Z_{deg}$ of the degeneration path 24 is dominated by primarily gate-source impedance between the first gate electrode 48 and the first source electrode 52. In absence of the feedback path 40 and the impedance $Z_{REAL}$ generated by the feedback path 40, the input matching circuitry 36 may be unable to simultaneously generate the input impedance $Z_{IN}$ at a sufficient level to match the RF source impedance $Z_{RF}$, while maintaining the NF below 1.5 dB. In contrast, by providing the feedback path 40 to generate the impedance $Z_{REAL}$ at the input node 18, the input matching circuitry 36 is able to simultaneously present a good match to the RF source impedance $Z_{RF}$ and maintain the low NF. Hence, the input matching circuitry 36 can provide the RF source impedance $Z_{IN}$ at the RF input node 12 to sufficiently match the RF source impedance $Z_{RF}$.

The effect of the impedance $Z_{REAL}$ in achieving impedance matching can be graphically illustrated in a Smith chart. In this regard, FIG. 3 is an exemplary Smith chart 64 providing a graphical illustration on how the impedance $Z_{REAL}$ generated by the feedback path 40 can have significant impact on matching the input impedance $Z_{IN}$ with the RF source impedance $Z_{RF}$ in the frequency selective LNA circuit 10A of FIG. 2.

Figure 3:
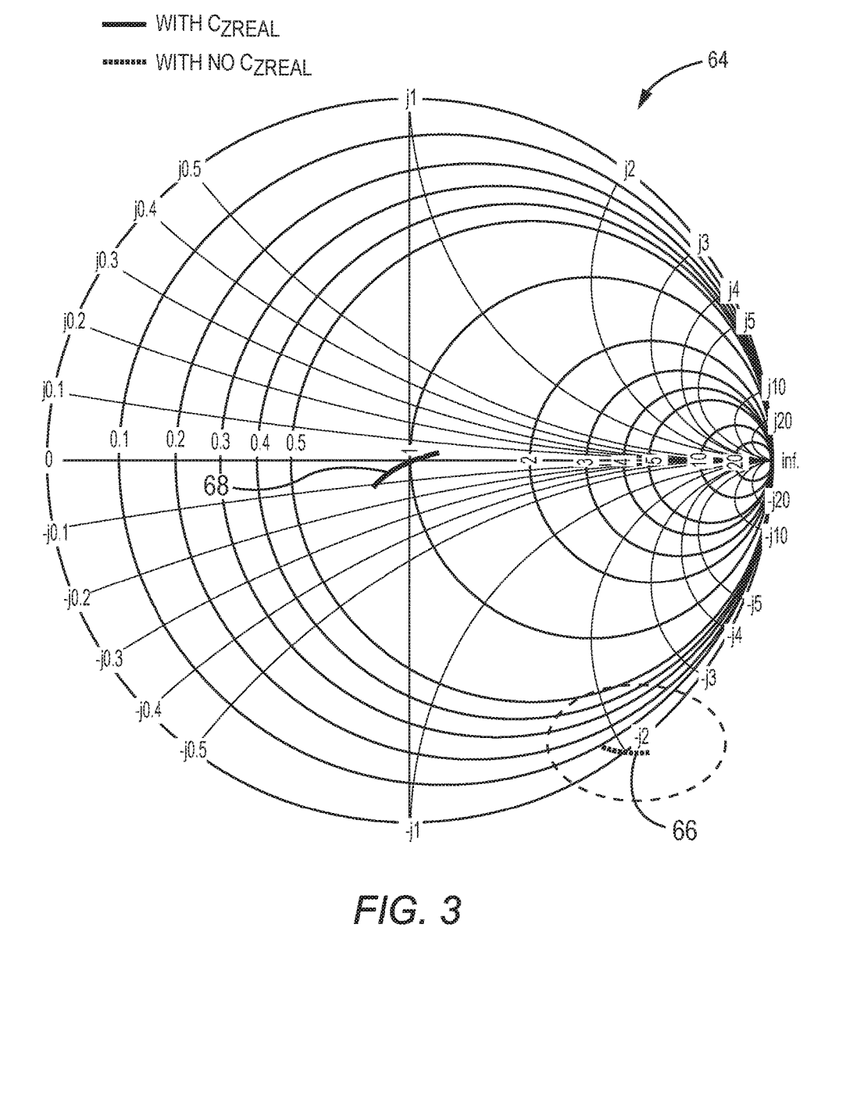
FIG. 3 is an exemplary Smith chart providing a graphical illustration on how an impedance generated by a feedback path can have significant impact on matching an input impedance with a radio frequency (RF) source impedance in the frequency selective LNA circuit of FIG. 2.

As shown in FIG. 3, in absence of the impedance $Z_{REAL}$ generated by the feedback path 40, the input impedance $Z_{IN}$ appears at point 66, which is on an edge of the Smith chart 64. This is an indication of impedance mismatch in the frequency selective LNA circuit 10A of FIG. 2. At some frequencies, locus of the input impedance ZIN may even go outside the Smith chart, which is an indication that the cascode common source LNA 42 is unstable. In contrast, in presence of the impedance $Z_{REAL}$ generated by the feedback path 40, the input impedance $Z_{IN}$ appears at a center point 68 of the Smith chart, which indicates that there is good impedance match in the frequency selective LNA circuit 10A and that the cascode common source LNA 42 is likely stable.

With reference back to FIG. 2, the filter circuitry 34 can provide both in-band and out-of-band frequency filtering. Ideally, the filter circuitry 34 would generate zero impedance at the in-band frequencies to make the degeneration path 24 a short circuit path and generate infinite impedance at the out-of-band frequencies to make the degeneration path an open circuit path. However, this is impossible in a real electrical circuit like the frequency selective LNA circuit 10A, especially when the filter circuitry 34 transitions from passing the in-band frequencies to blocking the out-of-band frequencies, and vice versa. In other words, the impedance $Z_{deg}$ of the degeneration path 24 can be small or large, but will never disappear completely. Thus, in absence of the impedance $Z_{REAL}$ generated by the feedback path 40, the impedance $Z_{deg}$ may cause stability issues to the cascode common source LNA 42.

As discussed earlier in FIG. 1, the real component of the impedance $Z_{REAL}$ generated by the feedback capacitor $C_{Zr}$ in the feedback path 40 can appear as the positive real impedance at the input node 18. As such, it is possible to control the feedback capacitor $C_{Zr}$ in the feedback path 40 to help overcome the negative real impedance $Z_{deg}$ at the input node 18, thus improving the stability of the cascode common source LNA 42.

Figure 4:
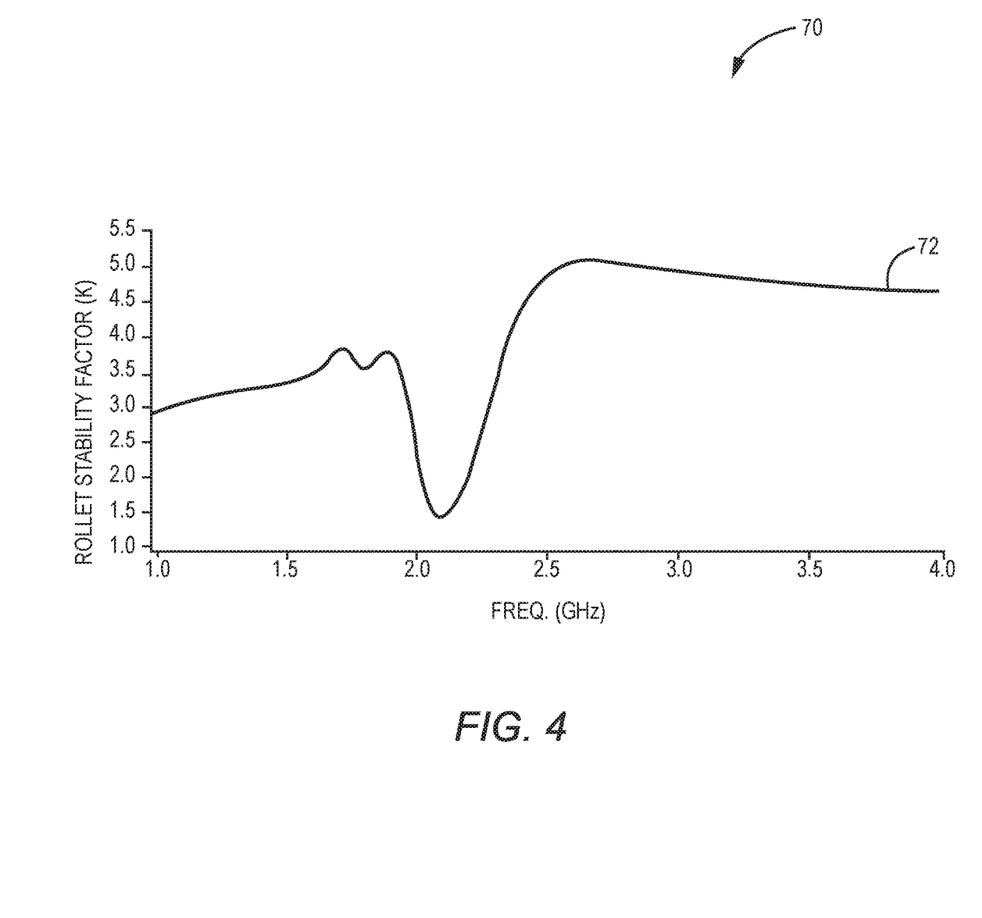
FIG. 4 is a graph providing an exemplary illustration of a Rollett stability factor of the cascode common source LNA of FIG. 2.

FIG. 4 is a graph 70 providing an exemplary illustration of Rollett stability factor associated with the cascode common source LNA 42 of FIG. 2. The graph 70 includes a Rollett stability factor curve 72, which illustrates that the Rollett stability factor of the cascode common source LNA 42 is always greater than one (1). As such, the cascode common source LNA 42 is unconditionally stable. Under certain circumstances, it may not be necessary to have unconditional stability for the cascode common source LNA 42. As such, it may be possible to provide the cascode common source LNA 32 with conditional stability (e.g., with a Rollett stability factor less than 1).

With reference back to FIG. 2, a third-order intercept point (IP3) is another figure-of-merit for linearity of the cascode common source LNA 42. Third-order intermodulation products are generated as a result of intermodulation between two or more signals having different frequencies due to the non-linearity in an amplifier. The IP3 is a theoretical power point at which a fundamental output line and a third-order distortion output line intercept. Higher IP3s indicate that higher magnitudes of out-of-band frequencies can be properly received and filtered. By providing high out-of-band compression points, the cascade common source LNA 42 maintains linearity in the presence of large out-of-band frequencies and avoids intermodulation distortion (IMD) products from interfering with the in-band frequencies. Simulation results indicate that the cascade common source LNA 42 can provide greater than +14 dBm IP3.

Figure 5A:
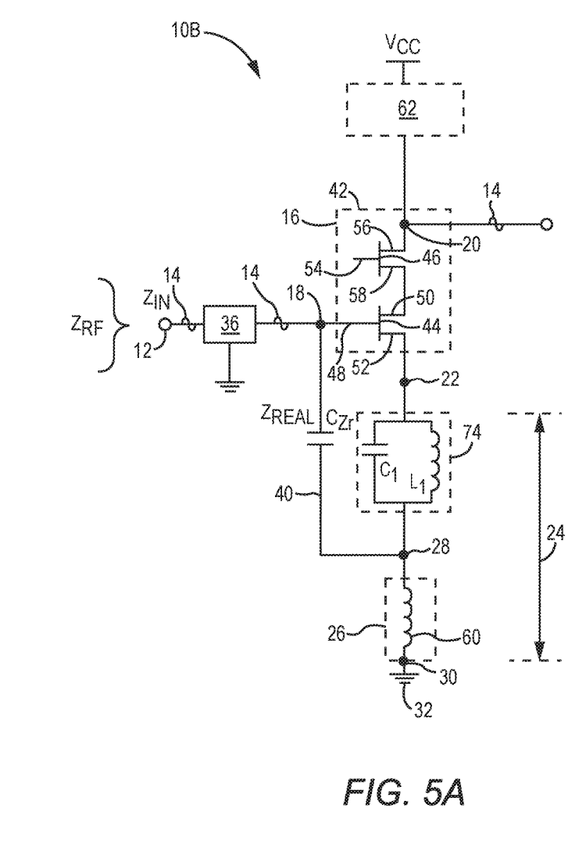
FIG. 5A is a schematic diagram of an exemplary frequency selective LNA circuit adapted from the frequency selective LNA circuit of FIG. 2 by implementing a filter circuitry based on at least one parallel inductor-capacitor (LC) circuit.
Figure 5B:
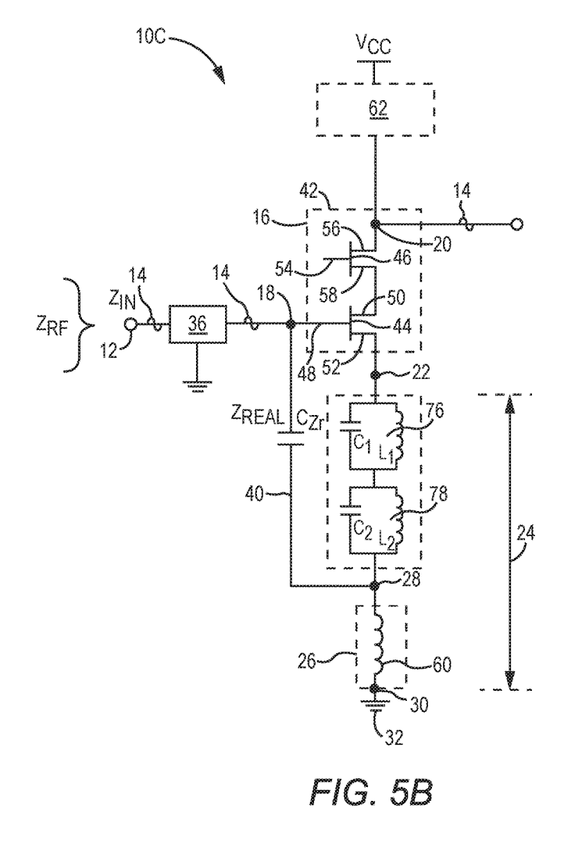
FIG. 5B is a schematic diagram of an exemplary frequency selective LNA circuit adapted from the frequency selective LNA circuit of FIG. 2 by implementing a filter circuitry based on at least two parallel LC circuits.

Various embodiments of the frequency selective LNA circuit 10A are now discussed in references to FIGS. 5A-5B. FIG. 5A is a schematic diagram of an exemplary frequency selective LNA circuit 10B adapted from the frequency selective LNA circuit 10A of FIG. 2 by implementing the filter circuitry 34 based on at least one parallel inductor-capacitor (LC) circuit 74. Common elements between FIGS. 2 and 5A are shown therein with common element numbers and will not be re-described herein.

The parallel LC circuit 74 includes an inductor $L_1$ and a capacitor $C_1$. The parallel LC circuit 74 is configured to function as the filter circuitry 34 of FIG. 2 to pass the in-band frequencies and block the out-of-band frequencies. In this regard, the parallel LC circuit 74 is configured to generate the first impedance (e.g. approximately 1Ω) at the in-band frequencies and the second impedance substantially higher than the first impedance (e.g., greater than 100Ω) at the out-of-band frequencies. Given that the impedance $Z_{REAL}$ generated by the feedback path 40 can help improve the stability of the cascode common source LNA 42, the parallel LC circuit 74 can be built with medium Q-factor ($10 \leq Q\text{-factor} \leq 35$) inductor and/or capacitor without compromising the stability of the cascode common source LNA 42.

FIG. 5B is a schematic diagram of an exemplary frequency selective LNA circuit 10C adapted from the frequency selective LNA circuit 10A of FIG. 2 by implementing the filter circuitry 34 based on at least one first parallel LC circuit 76 and at least one second parallel LC circuit 78. Common elements between FIGS. 2 and 5B are shown therein with common element numbers and will not be re-described herein.

The first parallel LC circuit 76 and the second parallel LC circuit 78 are provided in a serial arrangement and configured to function as the filter circuitry 34 of FIG. 2 to pass the in-band frequencies and block the out-of-band frequencies in at least two different stop bands. In this regard, the first parallel LC circuit 76, which includes an inductor $L_1$ and a capacitor $C_1$, can be configured to generate the first impedance to pass the in-band frequencies and generate the second impedance to block the out-of-band frequencies at a first stop band. Likewise, the second parallel LC circuit 78, which includes an inductor $L_2$ and a capacitor $C_2$, can be configured to generate the first impedance to pass the in-band frequencies and generate the second impedance to block the out-of-band frequencies at a second stop band. Given that the impedance $Z_{REAL}$ generated by the feedback path 40 can help improve the stability of the cascode common source LNA 42, both the first parallel LC circuit 76 and the second parallel LC circuit 78 can be built with medium Q-factor ($10 \leq Q\text{-factor} \leq 35$) inductors and/or capacitors without compromising the stability of the cascode common source LNA 42.

Figure 6:
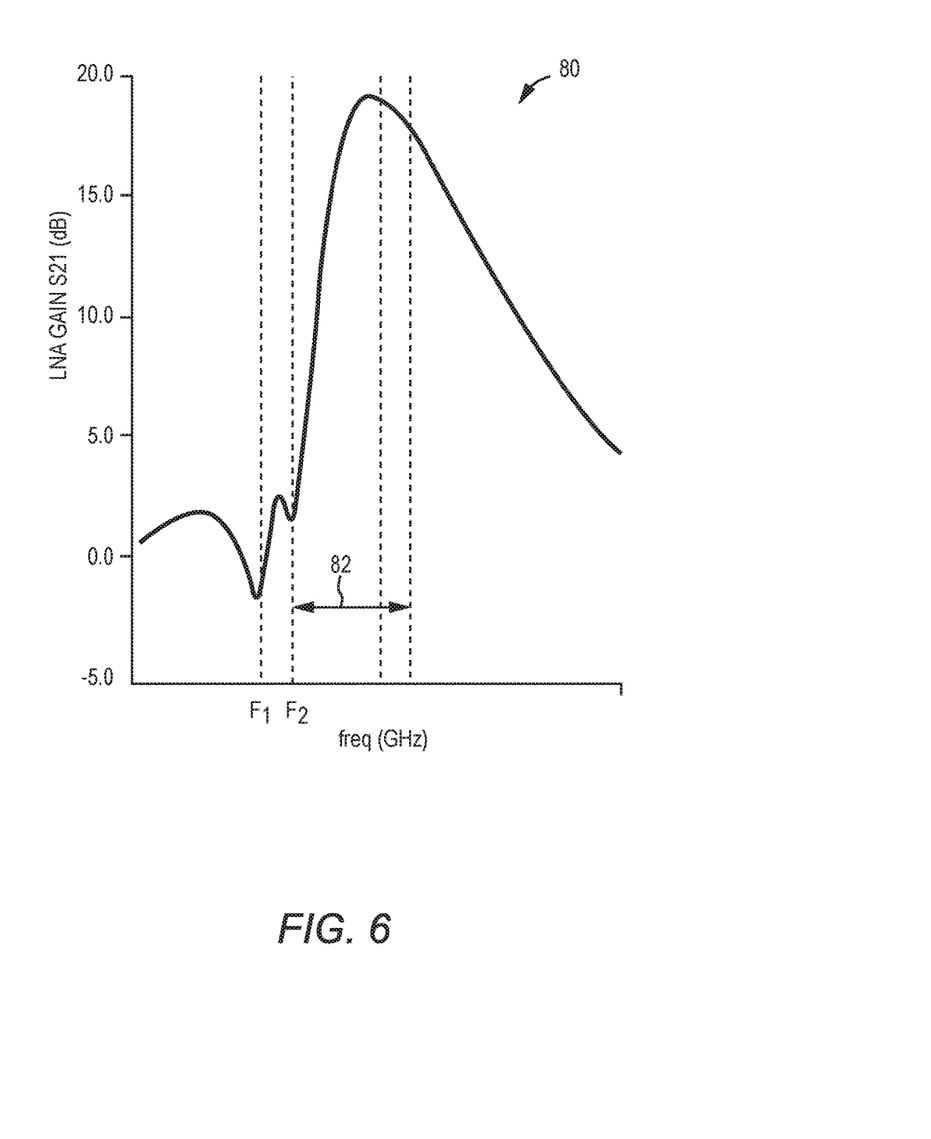
FIG. 6 is an LNA gain versus frequency graph providing an exemplary illustration of a first parallel LC circuit and a second parallel LC circuit of FIG. 5B configured to block out-of-band frequencies at a first stop band and a second stop band, respectively.

FIG. 6 is an LNA gain versus frequency graph 80 providing an exemplary illustration of the first parallel LC circuit 76 and the second parallel LC circuit 78 of FIG. 5B configured to block the out-of-band frequencies at the first stop band and the second stop band, respectively. As shown in FIG. 6, the first parallel LC circuit 76 can block the out-of-band frequencies at the first stop band $F_1$ and the second parallel LC circuit 78 can block the out-of-band frequencies at the second stop band $F_2$. Both the first parallel LC circuit 76 and the second parallel LC circuit 78 can pass the in-band frequencies in pass band 82.

Figure 7:
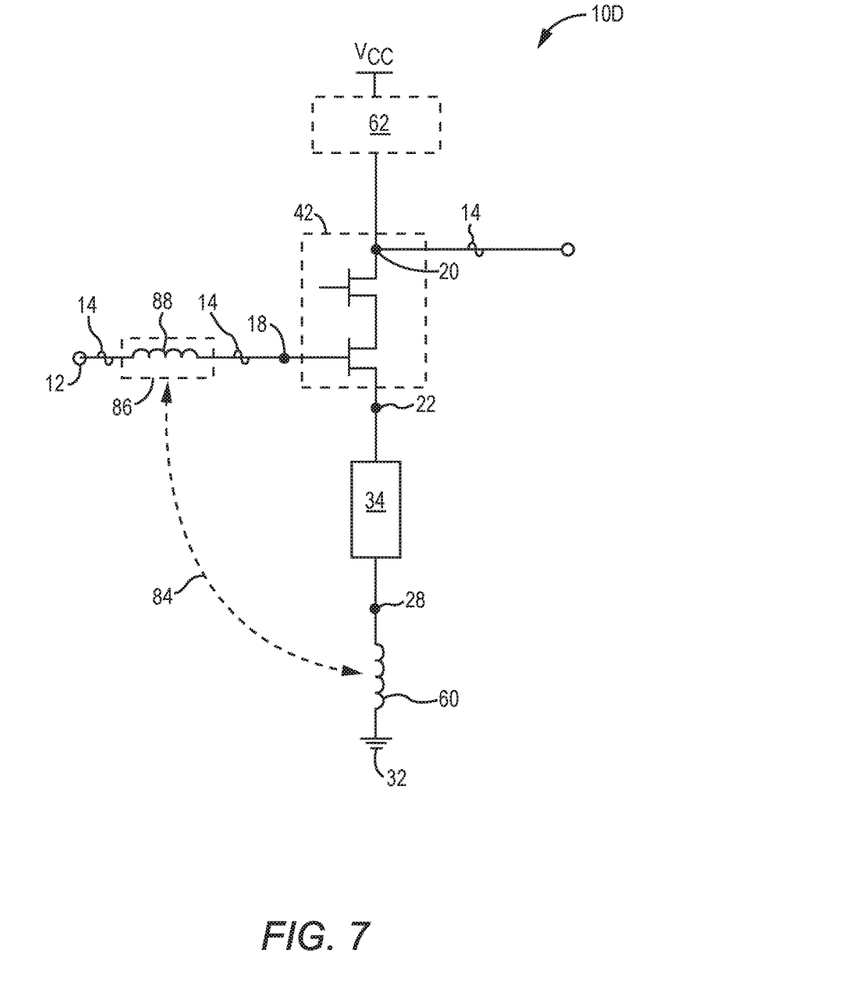
FIG. 7 is a schematic diagram of an exemplary frequency selective LNA circuit in which a feedback path is provided via inductive coupling.

FIG. 7 is a schematic diagram of an exemplary frequency selective LNA circuit 10D in which a feedback path 84 is provided via inductive coupling. Common elements between FIGS. 2 and 7 are shown therein with common element numbers and will not be re-described herein.

The frequency selective LNA circuit 10D includes input matching circuitry 86, which is implemented by a matching inductor 88. The feedback path 84 is provided via the inductive coupling between the matching inductor 88 and the degeneration inductor 60.

Figure 8:
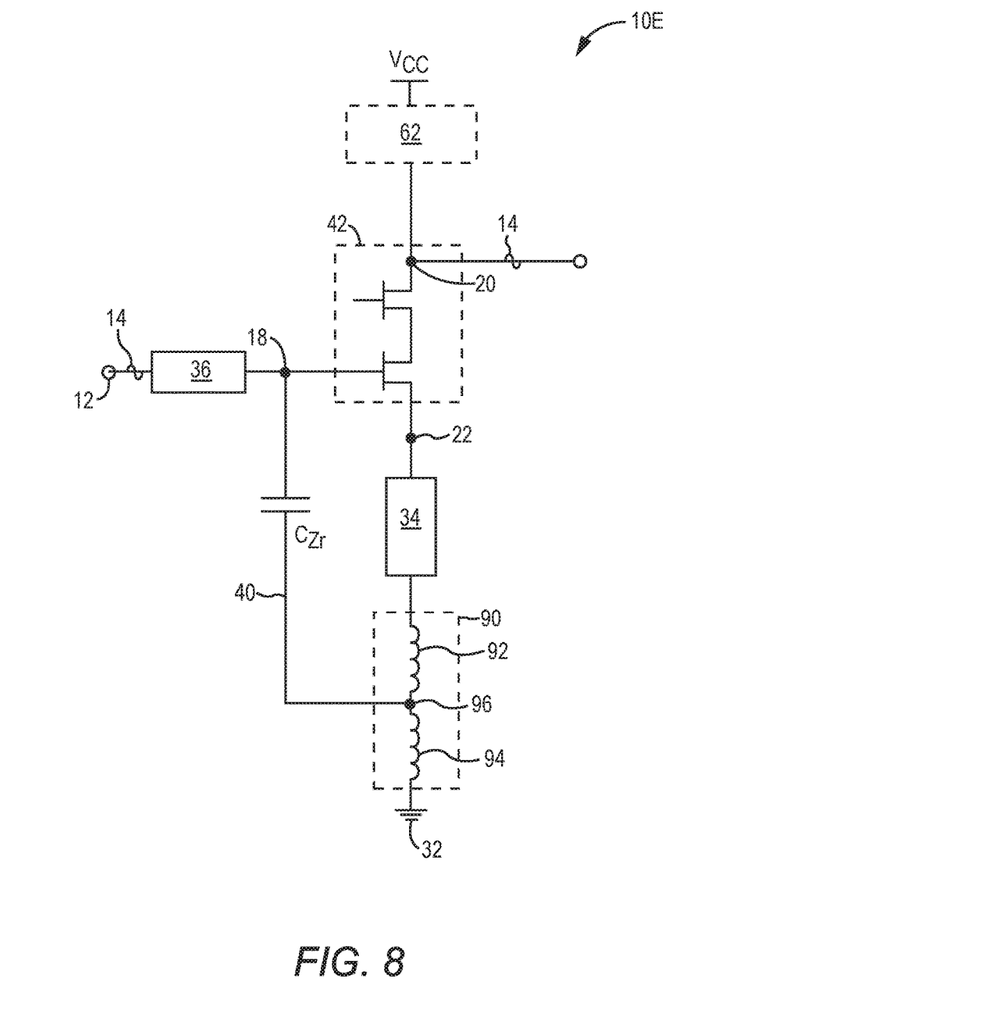
FIG. 8 is a schematic diagram of an exemplary frequency selective LNA circuit in which degeneration circuitry includes a first degeneration inductor and a second degeneration inductor connected in series.

FIG. 8 is a schematic diagram of an exemplary frequency selective LNA circuit 10E in which degeneration circuitry 90 includes a first degeneration inductor 92 and a second degeneration inductor 94 connected in series. Common elements between FIGS. 2 and 7 are shown therein with common element numbers and will not be re-described herein.

The first degeneration inductor 92 is coupled to the second degeneration inductor 94 at a coupling point 96. The feedback path 40 is coupled between the input node 18 of the cascode common source LNA 42 and the coupling point 96.

Figure 9:
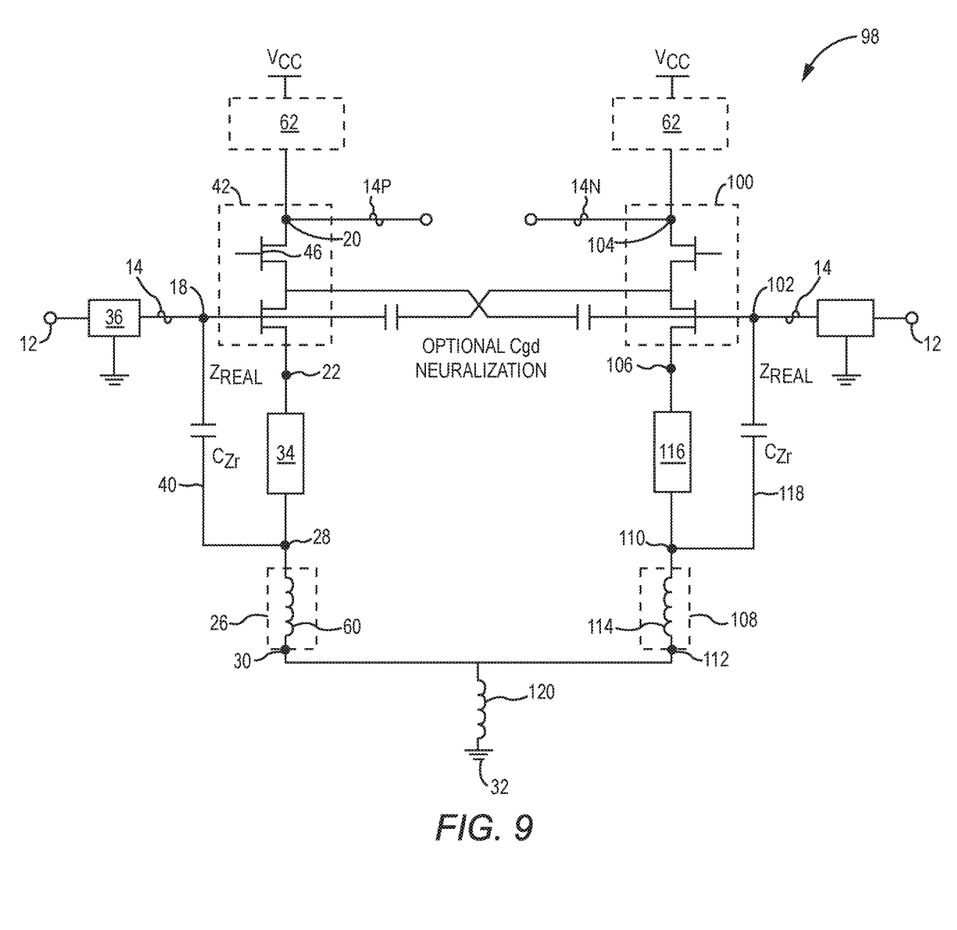
FIG. 9 is a schematic diagram of an exemplary differential frequency selective LNA circuit.

FIG. 9 is a schematic diagram of an exemplary differential frequency selective LNA circuit 98 that is adapted from the frequency selective LNA circuit 10A of FIG. 2. Common elements between FIGS. 2 and 9 are shown therein with common element numbers and will not be re-described herein.

The differential frequency selective LNA circuit 98 includes a second transconductive LNA 100, which can be implemented as a second cascode common source LNA such as the cascode common source LNA 42. The second transconductive LNA 100 includes a second input node 102 configured to receive the RF signal 14, a second output node 104 configured to output the RF signal 14, and a second common node 106. The differential frequency selective LNA circuit 98 includes second degeneration circuitry 108, which has a second input end 110 and a second output end 112. The second degeneration circuitry 108 may include a second degeneration inductor 114.

The differential frequency selective LNA circuit 98 includes second filter circuitry 116 provided between the second common node 106 and the second input end 110. Like the filter circuitry 34, the second filter circuitry 116 is also configured to generate the first impedance at the in-band frequencies and generate the second impedance at the out-of-band frequencies. The differential frequency selective LNA circuit 98 includes a second feedback path 118 coupled between the second input node 102 and the second input end 110. Like the feedback path 40, the second feedback path 118 is configured to generate the impedance $Z_{REAL}$ at the second input node 102. The second input node 102 is also coupled to the input matching circuitry 36.

The differential frequency selective LNA circuit 98 includes bias choke circuitry 120. The degeneration inductor 60 in the degeneration circuitry 26 is coupled between the input end 28 and the bias choke circuitry 120. The second degeneration inductor 114 in the second degeneration circuitry 108 is coupled between the second input end 110 and the bias choke circuitry 120. The output node 20 is configured to output the RF signal 14 as a positive RF signal 14P, while the second output node 104 is configured to output the RF signal 14 as a negative RF signal 14N.

Those skilled in the art will recognize improvements and modifications to the preferred embodiments of the present disclosure. All such improvements and modifications are considered within the scope of the concepts disclosed herein and the claims that follow.

What is claimed is:

1. A frequency selective low noise amplifier (LNA) circuit comprising:
    a radio frequency (RF) input node configured to receive an RF signal in a defined frequency band;
    a transconductive LNA comprising an input node configured to receive the RF signal, an output node configured to output the RF signal, and a common node;
    degeneration circuitry having an input end and an output end;
    filter circuitry provided between the common node of the transconductive LNA and the input end of the degeneration circuitry and configured to:
        generate a first impedance at in-band frequencies of the defined frequency band; and
        generate a second impedance higher than the first impedance at out-of-band frequencies outside the defined frequency band;
    a feedback path provided between the input node of the transconductive LNA and the input end of the degeneration circuitry to generate an impedance at the input node to cause the transconductive LNA to have a Rollett stability factor greater than one; and
    input matching circuitry coupled between the RF input node and the input node of the transconductive LNA and configured to provide an input impedance comprising the impedance generated by the feedback path to match to a source impedance at the RF input node.

2. The frequency selective LNA circuit of claim 1 wherein the feedback path is configured to generate the impedance at the in-band frequencies.

3. The frequency selective LNA circuit of claim 1 wherein the transconductive LNA has a noise figure below 1.5 decibel.

4. The frequency selective LNA circuit of claim 1 wherein the filter circuitry comprises at least one parallel inductor-capacitor (LC) circuit configured to:
    generate the first impedance in response to the RF signal being inside the defined frequency band; and
    generate the second impedance in response to the RF signal being outside the defined frequency band.

5. The frequency selective LNA circuit of claim 4 wherein the at least one parallel LC circuit has a quality factor (Q-factor) between ten and thirty-five.

6. The frequency selective LNA circuit of claim 1 wherein the filter circuitry comprises at least one first parallel inductor-capacitor (LC) circuit and at least one second parallel LC circuit, wherein:
    the at least one first parallel LC circuit and the at least one second parallel LC circuit are disposed in a serial arrangement;
    the at least one first parallel LC circuit is configured to:
        generate the first impedance in response to the RF signal being inside the defined frequency band; and generate the second impedance in response to the RF signal being inside a first stop band located outside the defined frequency band; and the at least one second parallel LC circuit is configured to:
generate the first impedance in response to the RF signal being inside the defined frequency band; and
generate the second impedance in response to the RF signal being inside a second stop band located outside the defined frequency band and the first stop band.

7. The frequency selective LNA circuit of claim 6 wherein the at least one first parallel LC circuit and the at least one second parallel LC circuit each have a quality factor (Q-factor) between ten and thirty-five.

8. The frequency selective LNA circuit of claim 1 wherein the feedback path comprises a feedback capacitor coupled between the input node of the transconductive LNA and the input end of the degeneration circuitry.

9. The frequency selective LNA circuit of claim 8 wherein the feedback capacitor is configured to provide a real component in the impedance generated by the feedback path.

10. The frequency selective LNA circuit of claim 1 wherein:
the RF input node is coupled to RF circuitry having an RF source impedance; and
the input matching circuitry is further configured to provide the input impedance matching the RF source impedance.

11. The frequency selective LNA circuit of claim 10 wherein each of the RF source impedance and the input impedance is approximately fifty ohms.

12. The frequency selective LNA circuit of claim 1 wherein the degeneration circuitry comprises a degeneration inductor coupled between the input end of the degeneration circuitry and a ground.

13. The frequency selective LNA circuit of claim 12 wherein:
the input matching circuitry comprises a matching inductor; and
the feedback path is provided via inductive coupling between the matching inductor and the degeneration inductor.

14. The frequency selective LNA circuit of claim 1 wherein:
the degeneration circuitry comprises a first degeneration inductor and a second degeneration inductor disposed according to a serial arrangement;
the first degeneration inductor is coupled between the common node of the transconductive LNA and a coupling point;
the second degeneration inductor is coupled between the coupling point and a ground; and
the feedback path is coupled between the input node of the transconductive LNA and the coupling point.

15. The frequency selective LNA circuit of claim 1 wherein the transconductive LNA is a cascode common source LNA comprising:
a first stage transistor comprising a first gate electrode, a first drain electrode, and a first source electrode, wherein the first gate electrode and the first source electrode are coupled to the input node and the common node of the transconductive LNA, respectively; and
a second stage transistor comprising a second gate electrode, a second drain electrode, and a second source electrode, wherein the second source electrode and the second drain electrode are coupled to the first drain electrode and the output node of the transconductive LNA, respectively.

16. The frequency selective LNA circuit of claim 15 wherein the first stage transistor is a transistor selected from the group consisting of: a field-effect transistor (FET); a metal-oxide semiconductor FET (MOSFET); and a bipolar junction transistor (BJT).

17. The frequency selective LNA circuit of claim 15 wherein the second stage transistor is a transistor selected from the group consisting of: a field-effect transistor (FET); a metal-oxide semiconductor FET (MOSFET); and a bipolar junction transistor (BJT).

18. The frequency selective LNA circuit of claim 1 further comprising:
a second transconductive LNA comprising a second input node configured to receive the RF signal, a second output node configured to output the RF signal, and a second common node;
second degeneration circuitry comprising a second input end and a second output end;
second filter circuitry provided between the second common node of the second transconductive LNA and the second input end of the second degeneration circuitry and configured to:
generate the first impedance at the in-band frequencies of the defined frequency band; and
generate the second impedance higher than the first impedance at the out-of-band frequencies outside the defined frequency band;
a second feedback path provided between the second input node of the second transconductive LNA and the second input end of the second degeneration circuitry to generate the impedance at the second input node; and
the input matching circuitry is further coupled between the RF input node and the second input node of the second transconductive LNA.

19. The frequency selective LNA circuit of claim 18 further comprising bias choke circuitry coupled to a ground, wherein:
the degeneration circuitry comprises a degeneration inductor coupled between the input end of the degeneration circuitry and the bias choke circuitry; and
the second degeneration circuitry comprises a second degeneration inductor coupled between the second input end of the second degeneration circuitry and the bias choke circuitry.

20. The frequency selective LNA circuit of claim 19 wherein:
the output node of the transconductive LNA is further configured to output the RF signal as a positive RF signal; and
the second output node of the second transconductive LNA is further configured to output the RF signal as a negative RF signal.

21. The frequency selective LNA circuit of claim 1 wherein the impedance generated by the feedback path causes the transconductive LNA to be unconditionally stable with the Rollett stability factor greater than one.

22. The frequency selective LNA circuit of claim 1 wherein the impedance generated by the feedback path causes the transconductive LNA to be conditionally stable.

* * * * *

UNITED STATES PATENT AND TRADEMARK OFFICE
CERTIFICATE OF CORRECTION

PATENT NO. : 10,164,578 B2
APPLICATION NO. : 15/689181
DATED : December 25, 2018
INVENTOR(S) : Marcus Granger-Jones et al.

Page 1 of 1

It is certified that error appears in the above-identified patent and that said Letters Patent is hereby corrected as shown below:

In the Specification

In Column 8, Line 7, replace "the cascade common" with --the cascode common--.

Signed and Sealed this
Twelfth Day of February, 2019

Andrei Iancu
*Director of the United States Patent and Trademark Office*